United States Patent [19]

Soloff

[11] Patent Number: 5,381,354

[45] Date of Patent: Jan. 10, 1995

[54] DIGITAL FILTERING OF BLOCKS OF DATA VALUES WITH SYMMETRIC DATA EXTENSION AT EDGES OF THE BLOCKS

[75] Inventor: Jonathan M. Soloff, Basingstoke, United Kingdom

[73] Assignee: Sony United Kingdom, Ltd., Staines, United Kingdom

[21] Appl. No.: 112,971

[22] Filed: Aug. 30, 1993

[30] Foreign Application Priority Data

Dec. 17, 1992 [GB] United Kingdom ............. 9226277

[51] Int. Cl.$^6$ ............................................. G06F 15/31
[52] U.S. Cl. .......................... 364/724.01; 364/724.13; 364/724.16
[58] Field of Search ............... 364/724.13, 724.16, 364/724.01, 724.02

[56] References Cited

U.S. PATENT DOCUMENTS

| 5,050,119 | 9/1991 | Lish ......................... 364/724.16 |
| 5,245,561 | 9/1993 | Sugiyama ................. 364/724.16 |
| 5,262,972 | 11/1993 | Holden et al. ........... 364/724.13 |

FOREIGN PATENT DOCUMENTS 2259422  3/1993  United Kingdom .

Primary Examiner—David H. Malzahn
Attorney, Agent, or Firm—William S. Frommer; Alvin Sinderbrand

[57] ABSTRACT

Digital filters are described for filtering blocks of data values. In order to reduce edge effects, symmetric data extension at the edges of the blocks is used. Multiplexers 34, 40, 46, 52 are used to pass data values between non-adjacent delay elements 36, 38, 42, 44, 48, 50 at leading and trailing edges of a data block to effect symmetric extension. The delay elements can be multisample delay elements and data being filtered can be multiplexed data.

9 Claims, 11 Drawing Sheets

DIGITAL FILTERING OF BLOCKS OF DATA VALUES WITH SYMMETRIC DATA EXTENSION AT EDGES OF THE BLOCKS

BACKGROUND OF THE INVENTION

1. Field of the Invention

This invention relates to the field of digital filtering.

2. Description of the Prior Art

It is known to provide digital filters, such as finite impulse response (FIR) filters and infinite impulse response (IIR) filters, comprising a chain of connected delay elements from between which taps are taken to multipliers. The multipliers apply appropriate weighting coefficients to the tap values before passing the weighted values to an adder that produces a filtered output value. Such digital filters are able to provide accurate and stable filter characteristics that make them suitable for use in high quality signal processing application, e.g. frequency separation and combination as part of transformations from the spatial domain to the frequency domain within an image data compression system.

One particular problem with digital filters of this type stems from the length of the chain of delay elements. In some filters, there may be tens or even hundreds of delay elements. Typically, when filtering data, a filtered output value relating to a particular position within the input data values will be produced when that position within the input data values is at the centre of the chain of delay elements. It is often the case that the data values to be filtered are formed of blocks of data values such as lines of image data values from a rastered image. In this case, filtered values for the edges of the blocks will be output when the input data values corresponding to the edges of the block are at the centre of the chain of delay elements. At such times, the chain of delay elements will only be half full of valid data. Unless this is compensated for, undesirable distortions (edge effects) will be introduced.

One technique of dealing with this is to extend the edges of the data in the manner described in co-pending U.S. patent application Ser. No. 07/957,094, filed Oct. 7, 1992, and which corresponds to British Patent Application 9124343.6 published as 2 261 565. Edge extension can take a number of forms. One of these forms is so-called symmetric edge extension whereby data values are repeated around the edges of the block of data in a manner as if they had been reflected by a mirror placed at the edge. Consider the data block:

1, 2, 3, 4, . . . , n−3, n−2, n−1, n.

This data block when subject to symmetric edge extension would, for example, become:

3, 2, 1, 2, 3, 4, . . . , n−3, n−2, n−1, n, n−1, n−2

One way of providing such edge extensions is to store each block of data values in memory and then read the data values from the memory in a modified sequence that produces an edge extended data block. Whilst this is effective in producing the correct sequence of data values, it can use disadvantageously large amounts of memory in applications such as image processing where the amount of data being handled is high and also introduces a delay into the processing of the system.

SUMMARY OF THE INVENTION

It is an object of the invention to provide a filter that is able to provide symmetric edge extension without the above mentioned disadvantages.

Viewed from one aspect this invention provides a digital filter for filtering blocks of data values, said digital filter comprising:

(i) a chain of delay elements for storing data values; and (ii) at least one multiplexer for selectively passing data values between inputs of non-adjacent delay elements to effect symmetric edge extension of said blocks of data values.

The invention uses the delay elements of the filter itself to act as memory from which data values can be switched with the multiplexers to positions in advance of a leading edge or behind a trailing edge to achieve edge extension. This approach avoids the extra hardware requirements and the delay associated with the previously proposed technique.

In preferred embodiments for achieving edge extension at a trailing edge, said at least one multiplexer comprises an end of block multiplexer for returning data values from alternate delay elements to an input of an upstream delay element to effect symmetric edge extension at a trailing edge of a block of data values.

It will be appreciated that digital filters can in some cases be long and contain many tens or hundreds of delay elements. It is usual in such filters that the coefficients by which each tapped data value is multiplied significantly decrease on moving away from the centre of the filter. Thus, the data values at the centre of the filter have a greater influence for their corresponding output value than those towards the edge of the filter. A consequence of this is that acceptable results may be achieved by edge extension sufficient to fill the significant central delay elements with data whilst leaving the peripheral delay elements at the trailing edge containing invalid data.

However, in shorter chains of delay elements and circumstances in which high quality is of paramount importance, said end of block multiplexer returns data values to an input of a first delay element within said chain of delay elements.

By returning data values to the first delay element within the chain, the filter will be completely loaded with valid data by the time the trailing edge reaches the centre of the filter.

In preferred embodiments for achieving edge extension at a trailing edge, said at least one multiplexer comprises at least one start of block multiplexer for passing data values to a downstream non-adjacent delay element to effect symmetric edge extension at a leading edge of a block of data values.

A convenient way of achieving effective edge extension at a leading edge is to provide that said at least one start of block multiplexer comprises a plurality of start of block multiplexers each for passing data values to one of alternate delay elements.

Each of the start of block multiplexers is able to select for input to its associated delay element either the data value in the preceding delay element or a data value from a non-adjacent upstream delay element.

In an analogous manner to the above, there is a balance between whether the overhead of completely filling a long chain of delay elements with edge extended data is justified. In the case of short filters in which quality is important, said plurality of start of block multiplexers act to pass data values from an input to a first delay element within said chain of delay elements.

It is sometimes convenient to use the hardware of a single digital filter to in effect perform the filtering operations of two differing filters. This may be achieved by providing that said delay elements have a multisample delay period and said blocks of data values comprise multiplexed sets of data values, said digital filter having switchable sets of filter coefficients for use with different multiplexed sets of data values.

The multiplexing of the sets of data values can still be handled by the edge extension mechanism of this invention. The data blocks need not even be in phase, i.e. the edge of one of the multiplexed data blocks need not necessarily be at the same point as the edge of the other multiplexed data blocks.

As previously mentioned, digital filters find application in many different fields. However, the filters of the invention have been found to be especially useful in situations in which said digital filter transforms image data between the spatial domain and the frequency domain.

Viewed from another aspect this invention provides a method of digitally filtering blocks of data values, said method comprising the steps of:

(i) storing data values within a chain of delay elements; and (ii) selectively passing data values between inputs of non-adjacent delay elements to effect symmetric edge extension of said blocks of data values.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
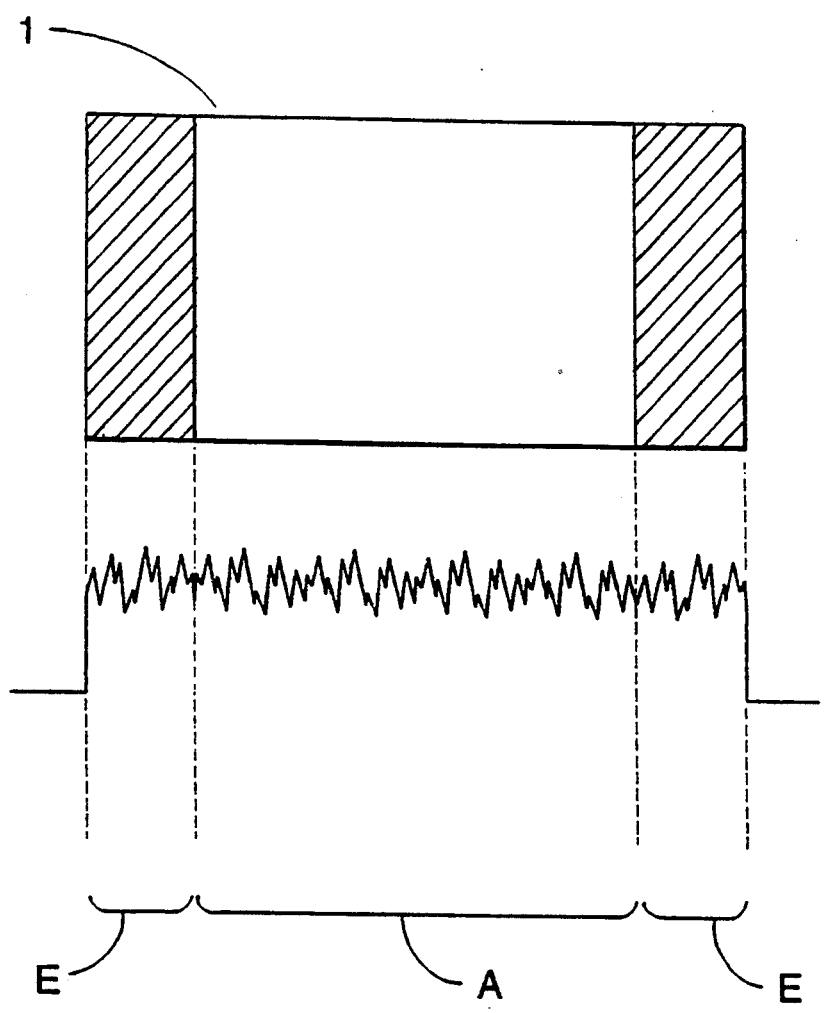
FIG. 1 schematically illustrates the use of edge extension in rastered image data.

FIG. 1 shows an array of image data values 1 that are to be subject to subband filtering to transform them into the spatial frequency domain. To effect horizontal spatial frequency separation, the image data is horizontally raster scanned and passed through high and low digital finite impulse response filters. Each horizontal raster line of data forms a block of data values having an active portion A. In order to reduce edge effects, symmetric extensions E are applied to the leading edge and the trailing edge.

FIGS. 2A to 2F illustrate a portion of a seven tap finite impulse response filter for performing edge extension at a leading edge. The filter has a chain of delay elements 2, 4, 6, 8, 10, 12. At the beginning and end of the chain and between the respective delay elements, taps are taken and fed to respective coefficient multipliers (not illustrated) and thence to an adder (not illustrated) in the usual manner.

Two-way multiplexers 14, 16, 18 (start of block multiplexers) are positioned between alternate delay elements and serve to connect their downstream delay element to either the preceding delay element or the input to the first delay element 2.

Figure 2A:
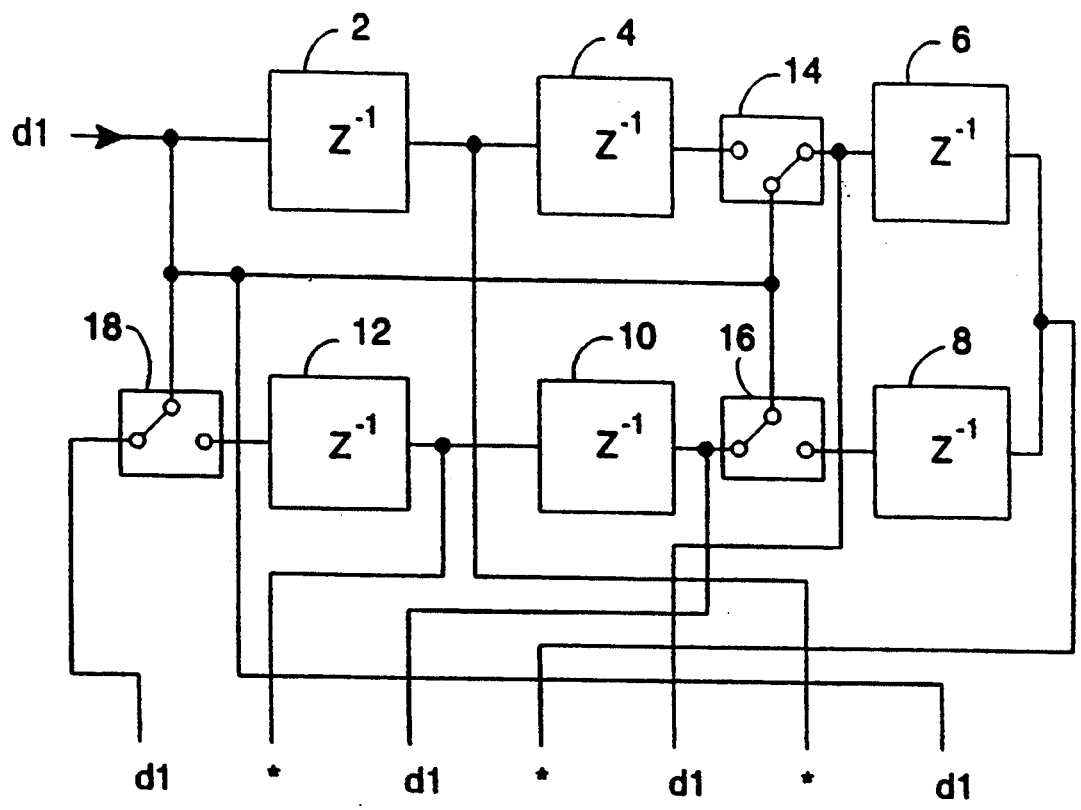
FIGS. 2A to 2F illustrate symmetric edge extension at the start of a block of data values.

FIG. 2A illustrates the state of the filter upon receipt of the first data value "d1" within a block of data values. The two-way multiplexers 14, 16, 18 all select this input value. The input value is also stored in the normal way within delay element 2.

Figure 2B:
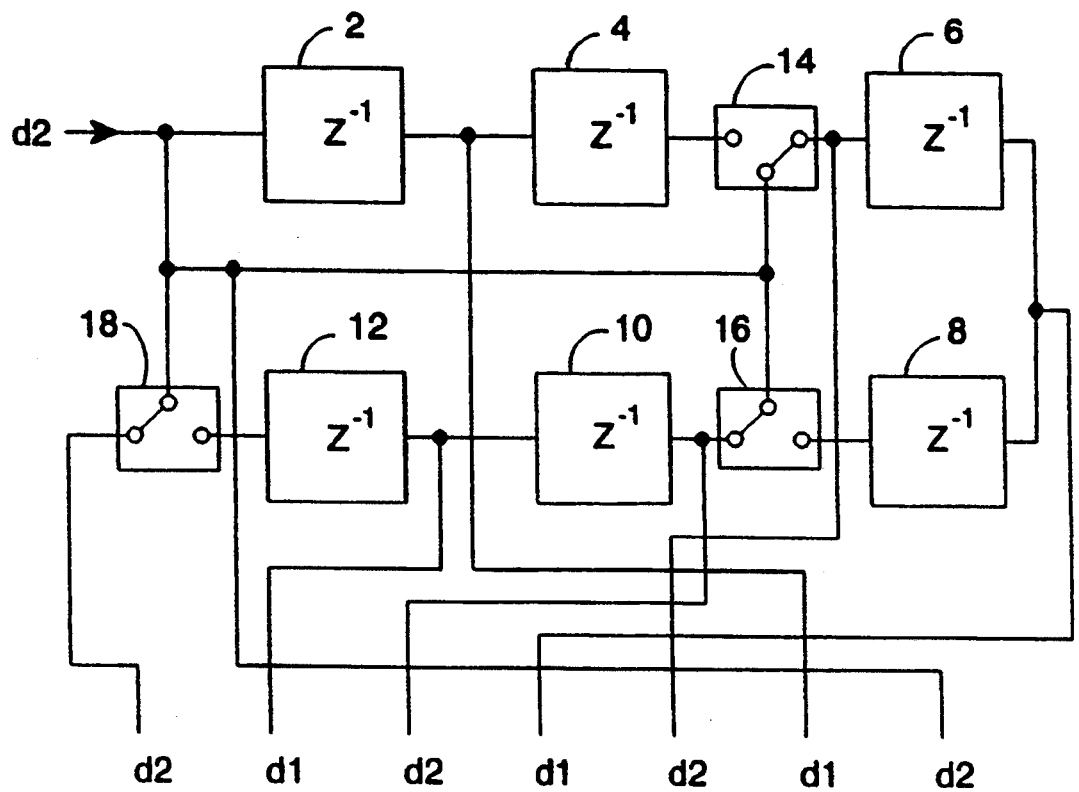

FIG. 2B illustrates the receipt of the second data value "d2". The two-way multiplexers 14, 16, 18 continue to select the data value "d2" input to the first delay element 2. The representations of the first data value "d1" previously stored are clocked into the delay elements downstream of their previous position.

Figure 2C:
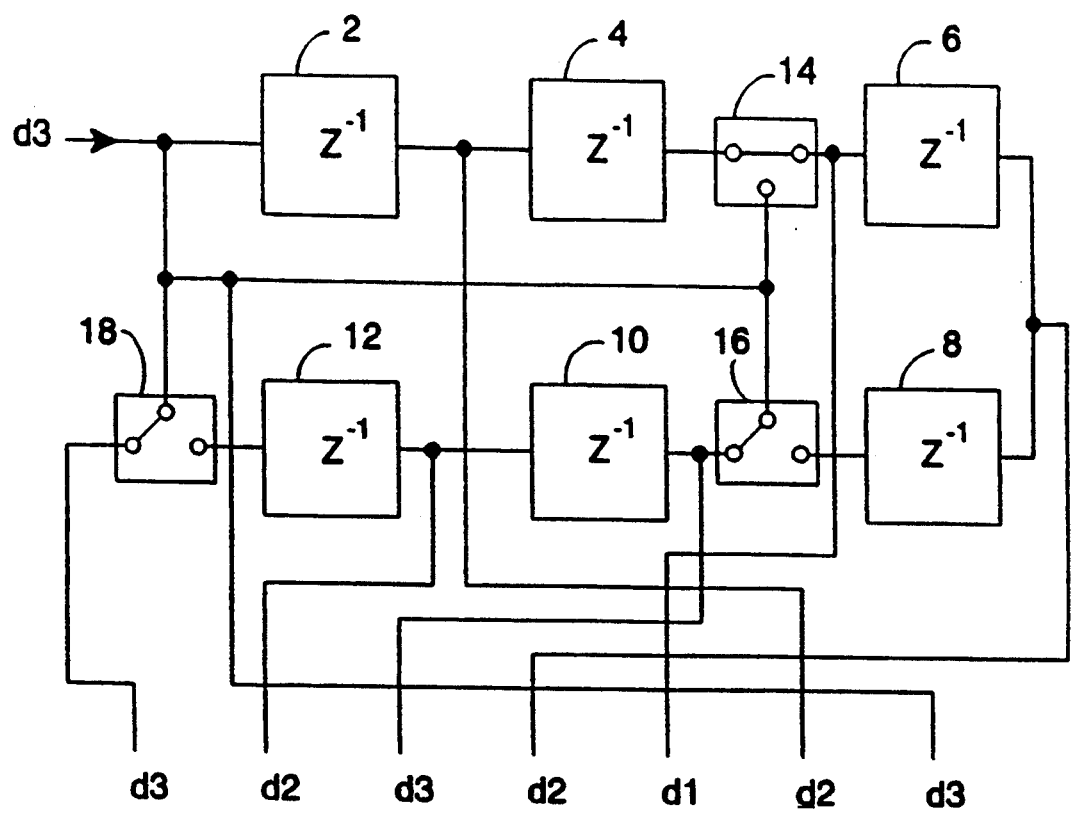

FIG. 2C illustrates receipt of the third data value "d3". The two-way multiplexer 14 changes its state to now select the data value from the preceding delay element 4 to be fed to the delay element 6. The other two-way multiplexers 16, 18 continue to select the data value input to the first delay element 2. The delay elements 2, 4, 6, 8, 10, 12 are also clocked to advance, where appropriate, the previously stored data values.

Figure 2D:
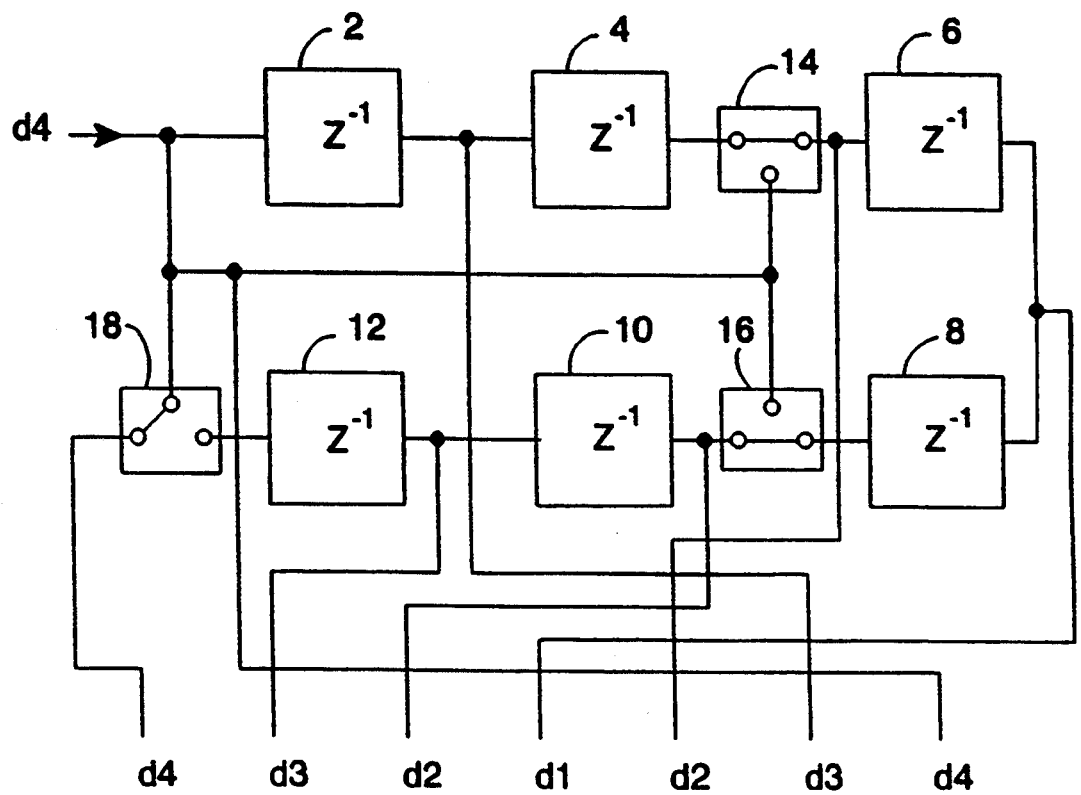

FIG. 2D illustrates receipt of the fourth data value "d4". The two-way multiplexer 16 now switches to feed the data value from the delay element 8 to the input of the delay element 10. The two-way multiplexer 18 selects the currently input data value "d4" to be fed to the final downstream tap rather than the output of the delay element 12. The previously stored data values are advanced by the clocking of the filter.

It will be seen that in FIG. 2D the first input data value "d1" has now reached the centre tap of the seven tap filter. At this point, it is desired to read the first filtered output value corresponding to a position at the edge of the horizontally raster scanned line. The action of the two way multiplexers 14, 16, 18 has been to feed forward data values to effectively extend the leading edge. Thus, it will be seen that the data values present upon the seven taps are symmetrically extended about the first data value "d1".

Figure 2E:
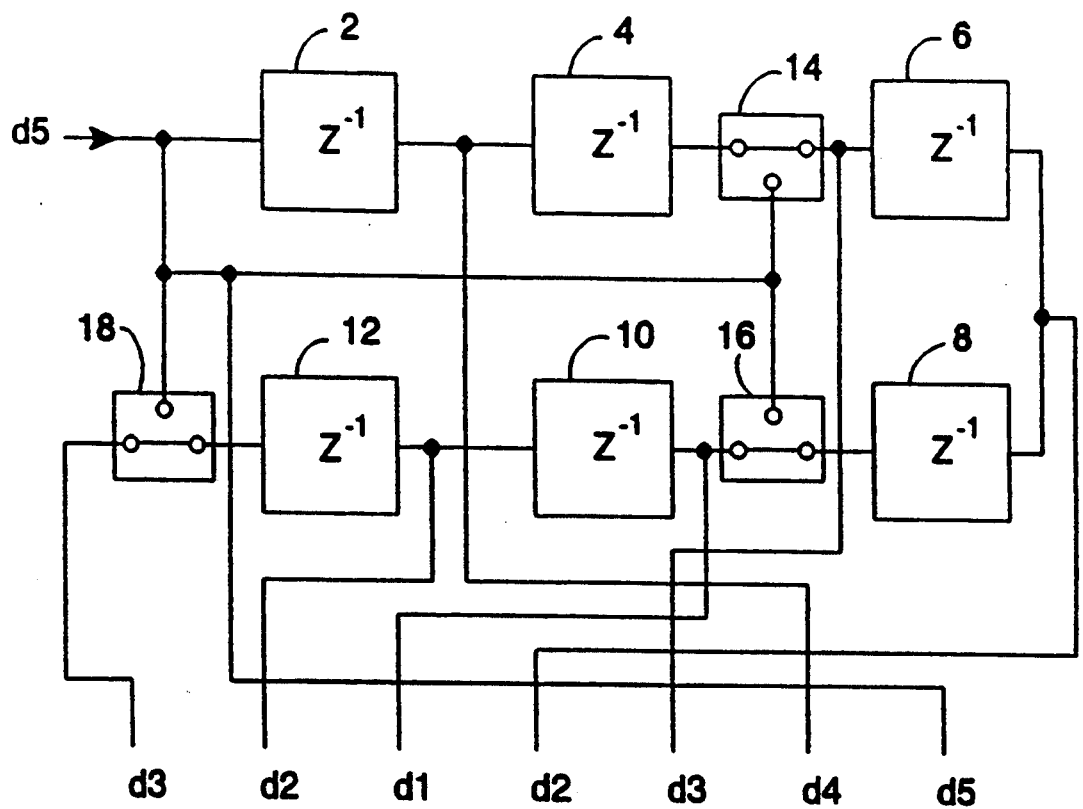
Figure 2F:
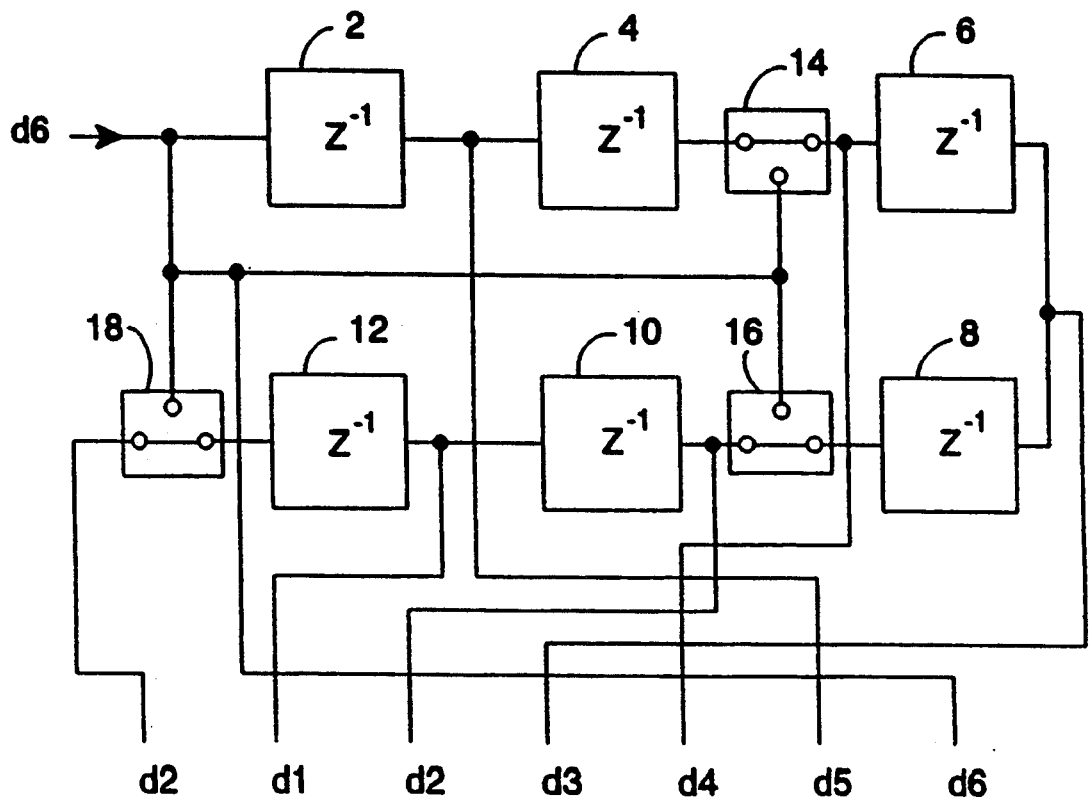

FIGS. 2E and 2F show the filter receiving the fifth and sixth data values "d5", "d6". In the case of the fifth data value "d5", the two-way multiplexer 18 selects the output from the delay element 12 to be fed to the final tap. The data values in all the other delay elements are advanced by one position. The second data value "d2" is now at the centre tap position of the filter with the extended data starting to be dropped from the end of the filter. This process continues as illustrated in FIG. 2F for the sixth data value "d6" and all subsequent data values until the trailing edge of the block of data values is reached.

FIGS. 3A to 3D illustrate end of block extension. A four-way multiplexer 32 (end of block multiplexer) is positioned at the input to a chain of delay elements 20, 22, 24, 26, 28, 30 of a seven tap filter. The four-way multiplexer 32 can select for input to the first delay element 20 either new data or data from successive alternate taps.

Figure 3A:
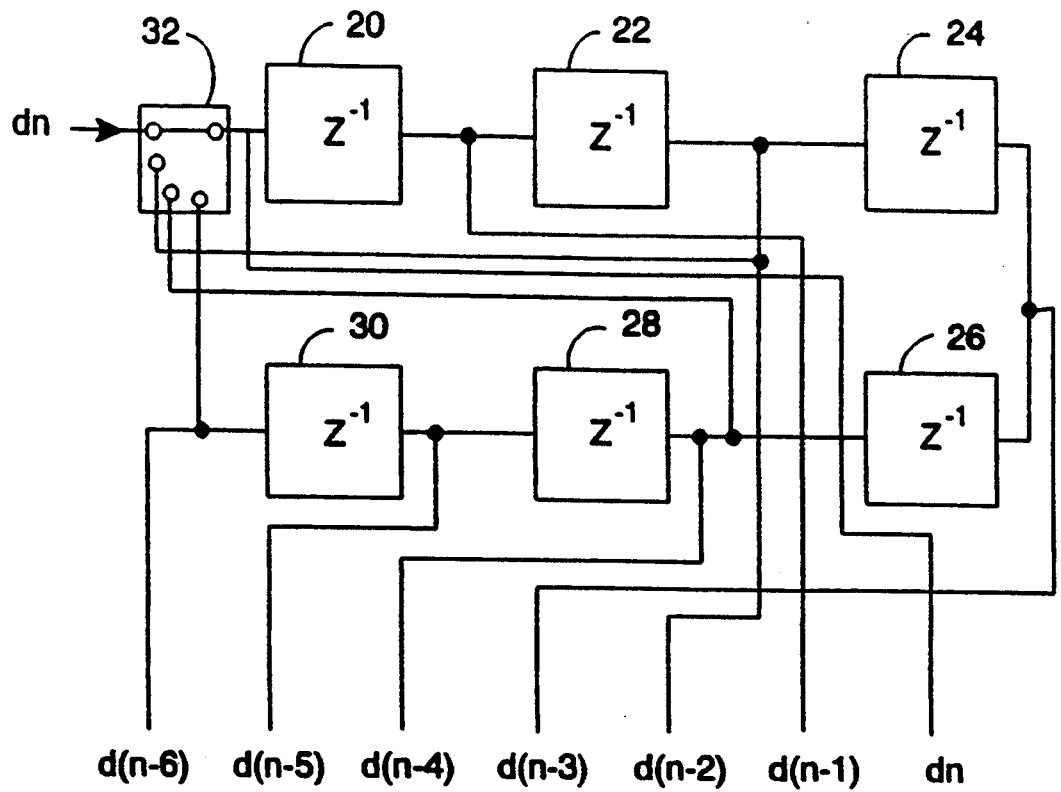
FIGS. 3A to 3D illustrate symmetric edge extension at the end of a block of data values.

FIG. 3A shows the state of the filter during the input of the last data value "dn" of a block of data. This data value "dn" is selected by the four-way multiplexer 32 to be fed to the first delay element 20.

Figure 3B:
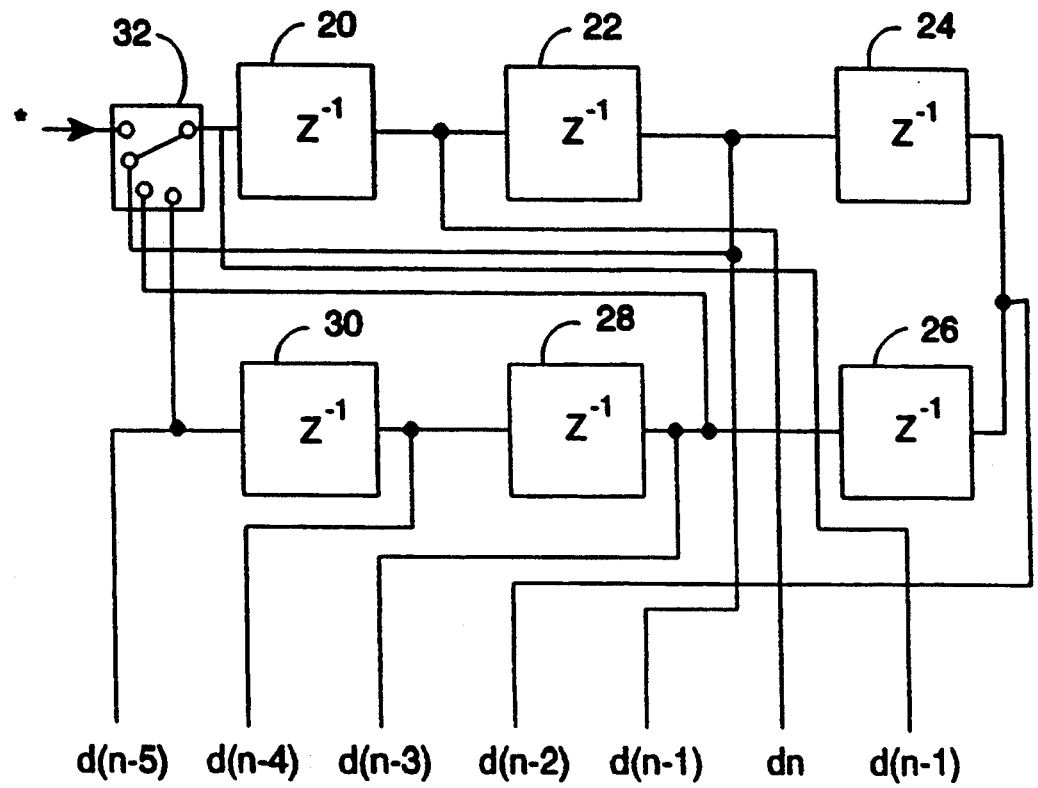

FIG. 3B illustrates the state of the filter on the next clock cycle. In this case, the four-way multiplexer 32 selects the data value "d(n−1)" from between the second delay element 22 and the third delay element 24. This data value "d(n−1)" is fed to the first delay element 20.

Figure 3C:
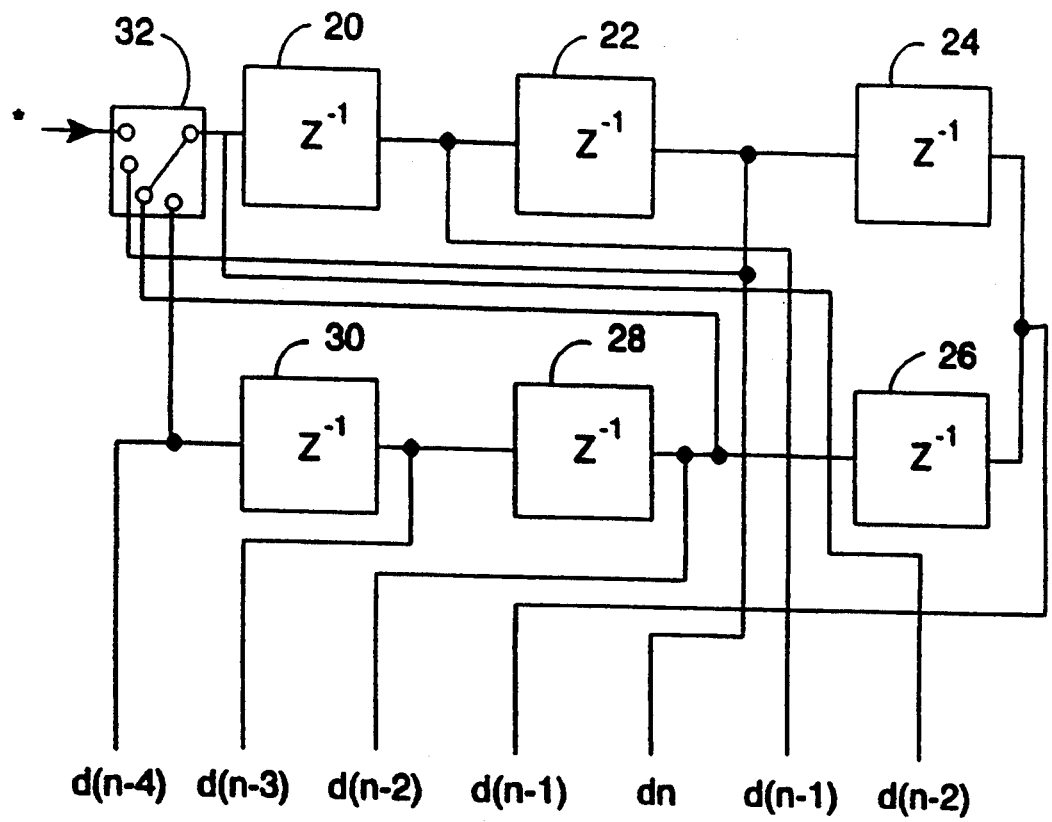
Figure 3D:
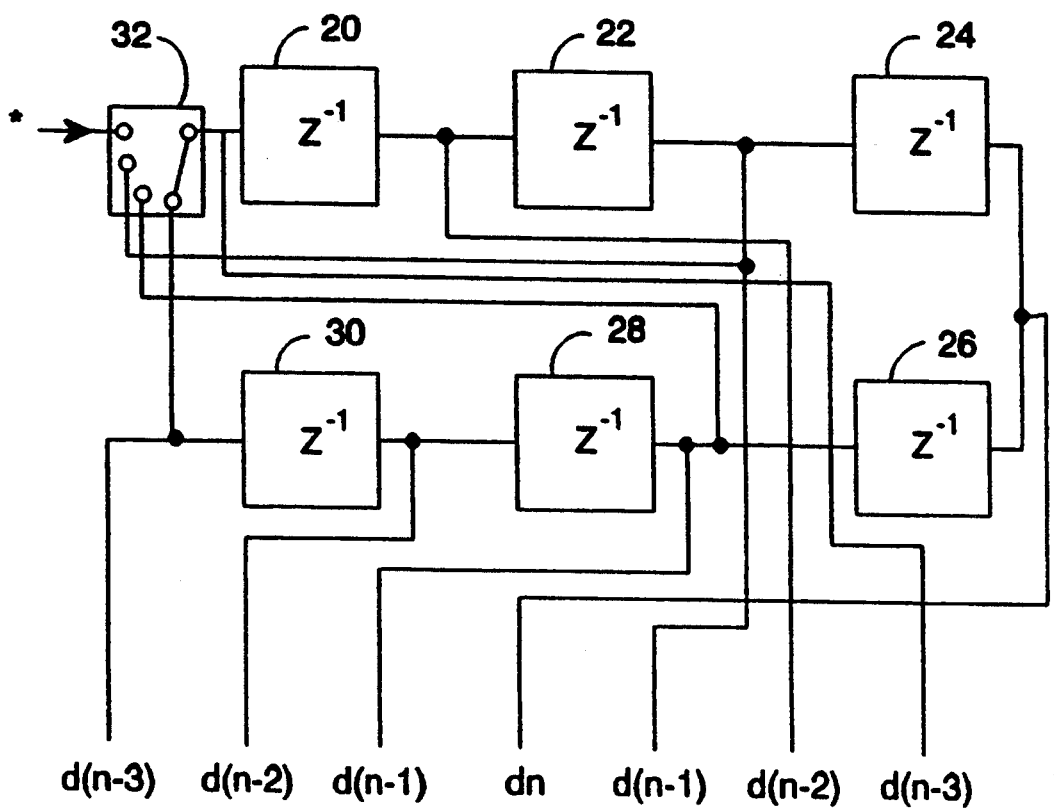

FIGS. 3C and 3D illustrate the next two clock cycles during which the four-way multiplexer 32 respectively selects the data values "d(n−2)" and "d(n−3)" for input to the first delay element 20.

The state illustrated in FIG. 3D has the last data value "dn" for the block of data values situated at the central tap. At this point, the taps from the succeeding delay elements have the symmetrically extended data values present upon them. The output from the filter in the state FIG. 3D will be the last valid output for the data block.

Figure 4:
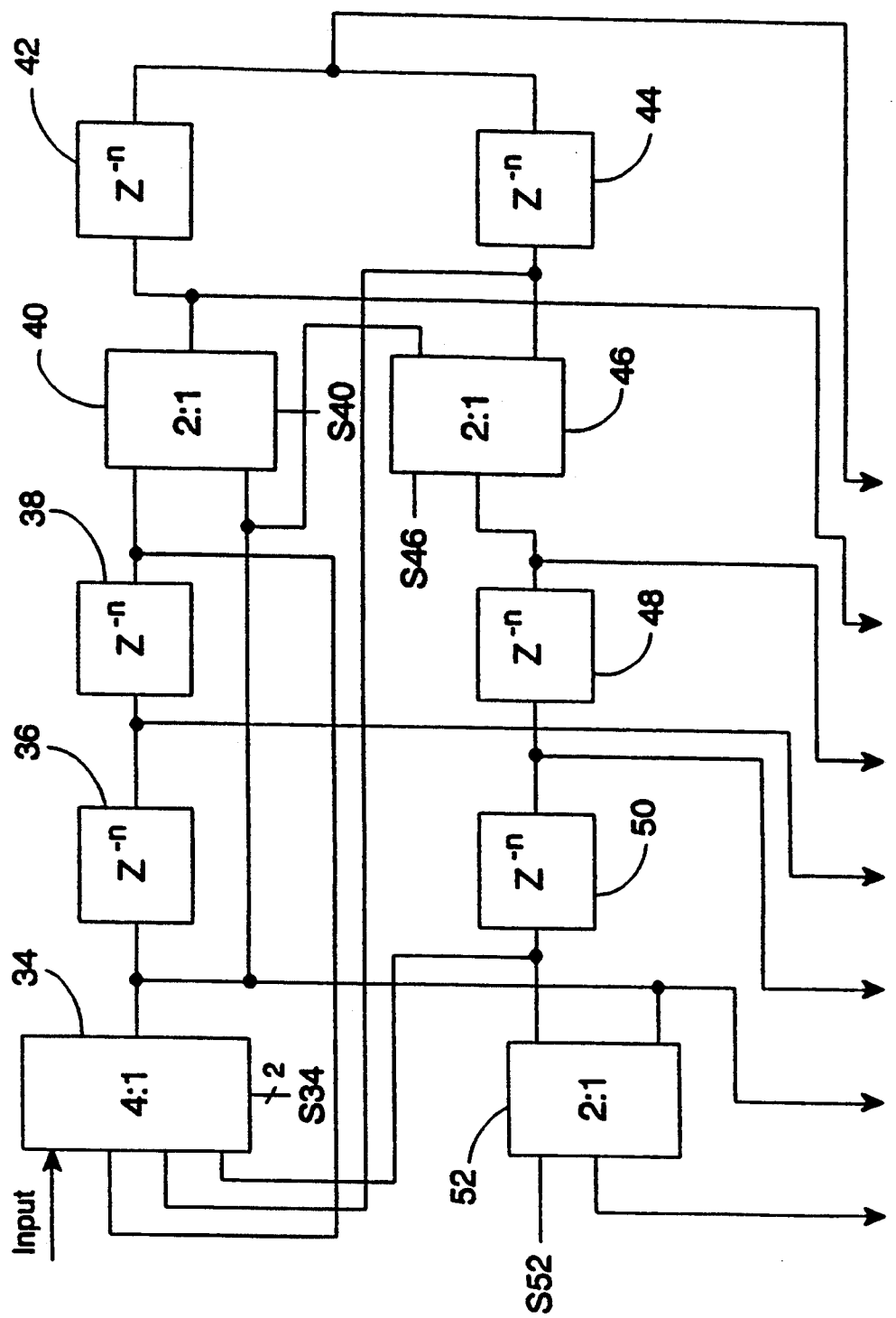
FIG. 4 illustrates a digital filter capable of both start of block and end of block edge extension.

FIG. 4 illustrates a generalised filter capable of performing both leading edge extension, as in FIGS. 2A to 2F, and trailing edge extension, as in FIGS. 3A to 3D. Once again, the filter is a seven tap filter with delay elements 36, 38, 42, 44, 48, 50 each acting as an n-sample delay. Two-way start of block multiplexers 40, 46 and 52 provide symmetric edge extension at the start of blocks in accordance with FIGS. 2A to 2F controlled by respective control signals S40, S46 and S52. A four-way end of block multiplexer 34 provides symmetric edge extension at the end of blocks in accordance with FIGS. 3A to 3B controlled by control signal S34.

Figure 5:
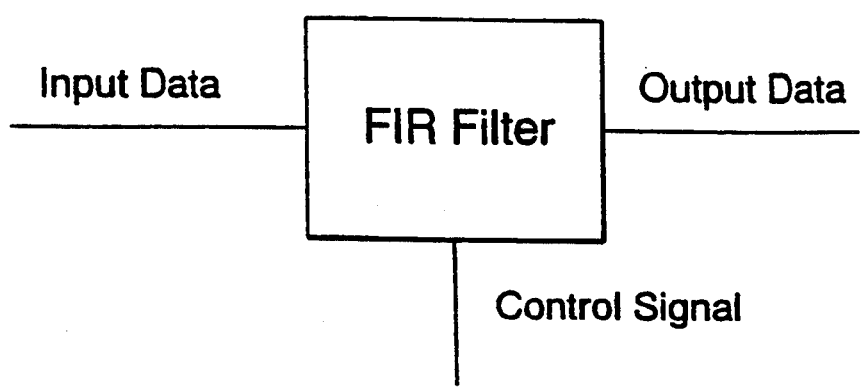
FIG. 5 illustrates a filter for handling multiplexed data.

FIG. 5 schematically illustrates a FIR filter. It is usual for such filters to have merely input data and a clock signal as their inputs and to apply fixed filter coefficients to generate filtered output data. In the case of the filters described above, additional control signals are fed to the filter to select the states of the multiplexers.

A counter (not illustrated) is used to give an indication as to what point within each block of data values has been reached. The output of this counter can then be fed to a state machine (not illustrated) that produces control signals for switching the multiplexers as illustrated in FIGS. 2A to 2F, FIGS. 3A to 3D and FIG. 4 at the required times. The state machine is relatively simple given that there is a direct mapping between the position within the data block and the state of the multiplexers.

The control signals fed to the filter can also be used to switch multiplier coefficients for each tap. In this way, a given set of filter hardware can in effect perform the function of two or more quite different filters, e.g. both a low pass filter and a high pass filter. Switching the filter coefficients serves to effectively multiplex data from different data blocks within a given stream of data. In order that the appropriate data values are fed to the multipliers and summed when the data stream is correspondingly multiplexed, it is necessary that each delay element should have a multisample delay sufficient to accommodate the intervening data values from between data values of the same set of multiplexed data values.

Figure 6A:
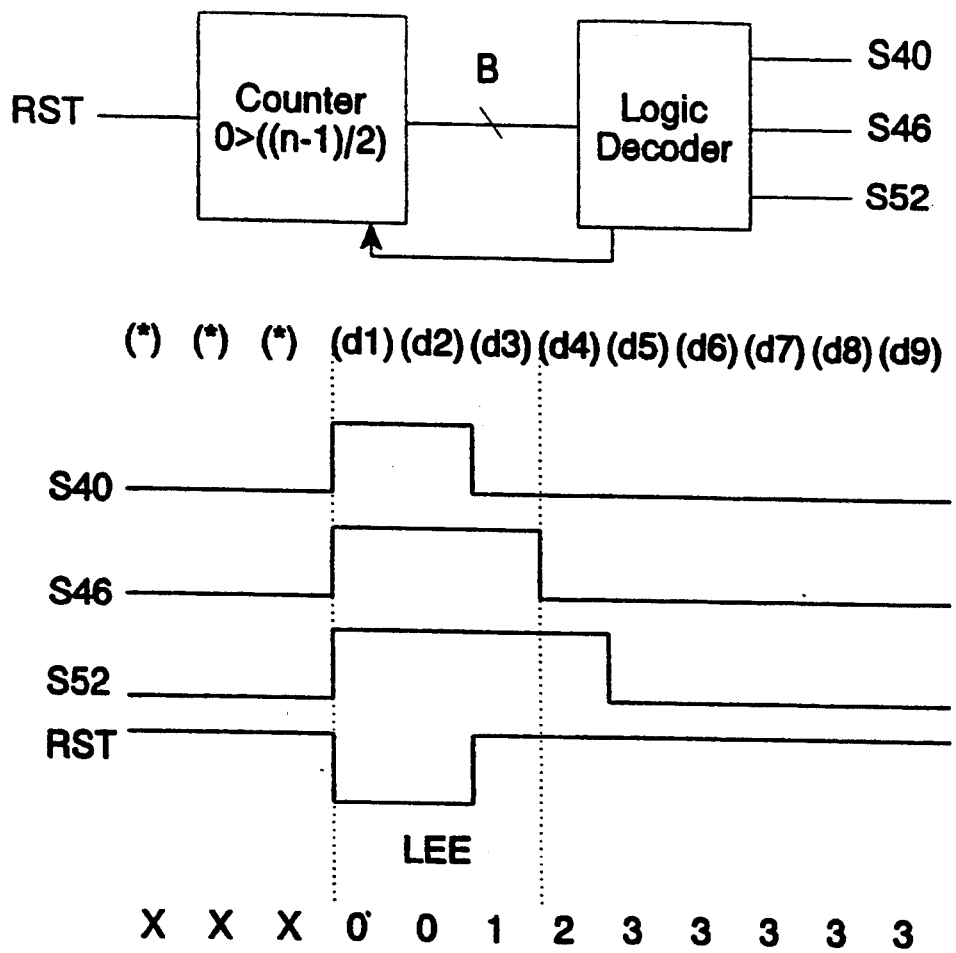
FIGS. 6A and 6B illustrate circuits for controlling the operation of the filter of FIG. 4.

FIG. 6A illustrates a circuit for controlling the multiplexers 40, 46 and 52 of FIG. 4 to carry out leading edge extension. A counter is provided that counts from 0 to $((n-1)/2)$, where n is the length of the filter (in this case 7). The output from the counter is a B-bit word, where $B = \text{ceil}[\log_2((n+1)/2)]$ (in this case 2). The counter is provided with a reset signal RST which goes from high to low at the receipt of the first valid input sample "d1" and goes from low to high upon receipt of the third sample "d3". When the "d3" sample is received, the counter adopts the first count value of "1" and upon subsequent samples counts up to "3" and then maintains the value of "3" for the rest of the valid data.

A logic decoder receives the B-bit count from the counter and decodes this into three control signals S40, S46 and S52 which respectively control the multiplexers 40, 46 and 52 of FIG. 4. The timings of these control signals S40, S46 and S52 are illustrated relative to the RST signal and the data samples being input. The logic decoder may be a PROM to effect a mapping from the B-bit word to a 3-bit word comprising one bit for each of S40, S46 and S52 or alternatively in an ASIC design a more component efficient hard-logic decoder may be provided.

It will be seen that during receipt of the samples "d1" and "d2" the signals S40, S46 and S52 all have the same value corresponding to the same switched states of the multiplexers 40, 46 and 52 of FIG. 4 as illustrated in FIGS. 2A and 2B. After receipt of the "d2" sample, the first multiplexer 40 in the chain switches states corresponding to the situation shown in FIG. 2C. After receipt of the two subsequent samples "d3" and "d4", the second and third multiplexers 46, 52 respectively switch states as illustrated in FIGS. 2D and 2E. When the B-bit count value reaches "3", a feedback signal from the logic decoder is applied to the counter to maintain the count value at "3" throughout the receipt of the remaining valid sample values.

During receipt of the first three sample values "d1", "d2" and "d3" the action of the multiplexers controlled by the control signals S40, S46 and S52 is to bring about leading edge extension LEE. At times before the receipt of the first sample "d1", the state of the counter is undefined as indicated by the symbol "X".

Figure 6B:
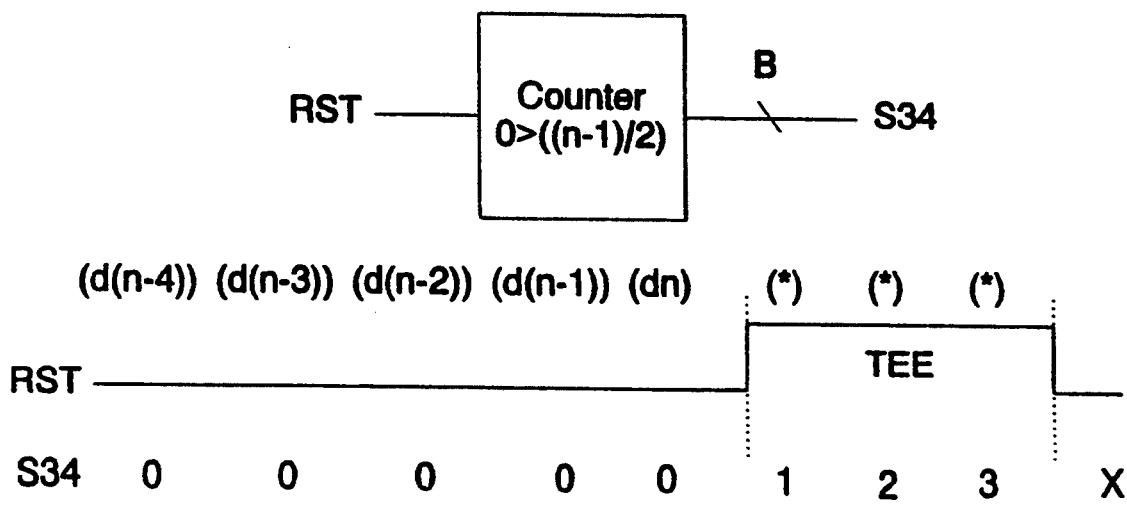

FIG. 6B illustrates how the control signal S34 required to control the four way multiplexer 34 of FIG. 4 can be generated. A 0 to $((n-1)/2)$ counter with a B-bit output is provided as in FIG. 6A. After receipt of the last valid sample "dn", the reset signal RST applied to the counter goes from low to high and the counter commences a count from "1" to "3" upon each of the subsequent sample periods. This B-bit count is used directly as the control signal S34 applied to the four way multiplexer 34 and acts to switch in between its four respective positions as illustrated in FIGS. 3A to 3D. The three sample periods during which the four way multiplexer 34 is switched between its states effect trailing edge extension TEE. After the third non-valid sample, it no longer matters what the value of the counter is, as is indicated by the symbol "X". Prior to receipt of the last valid sample "dn", the counter value is held at zero until released by the reset signal RST.

FIGS. 7A to 7F illustrate leading edge symmetric edge extension in the case of a data stream containing interleaved high pass and low pass data values. The delay elements 54, 56, 58, 60, 62, 64 are two sample delay elements. In this example, the low pass data and high pass data are arranged in blocks that are in phase. The result of this is that the two-way multiplexers 68, 70, 72 act at the same time for each of the sets of data values. Accordingly, each of FIGS. 7A to 7F represent two clock cycles having been applied to the filter and two output filtered data values having been produced.

Figure 7A:
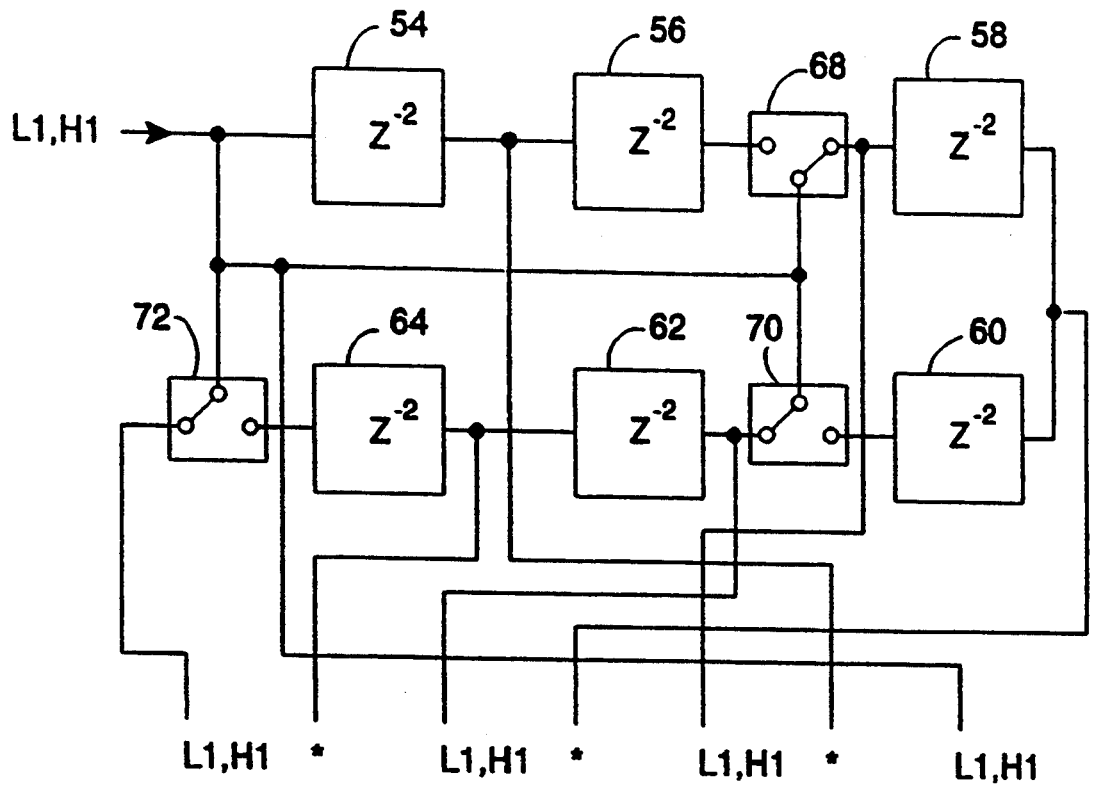
FIGS. 7A to 7F illustrate edge extension at the start of a block of data blocks of multiplexed high and low pass data.
Figure 7B:
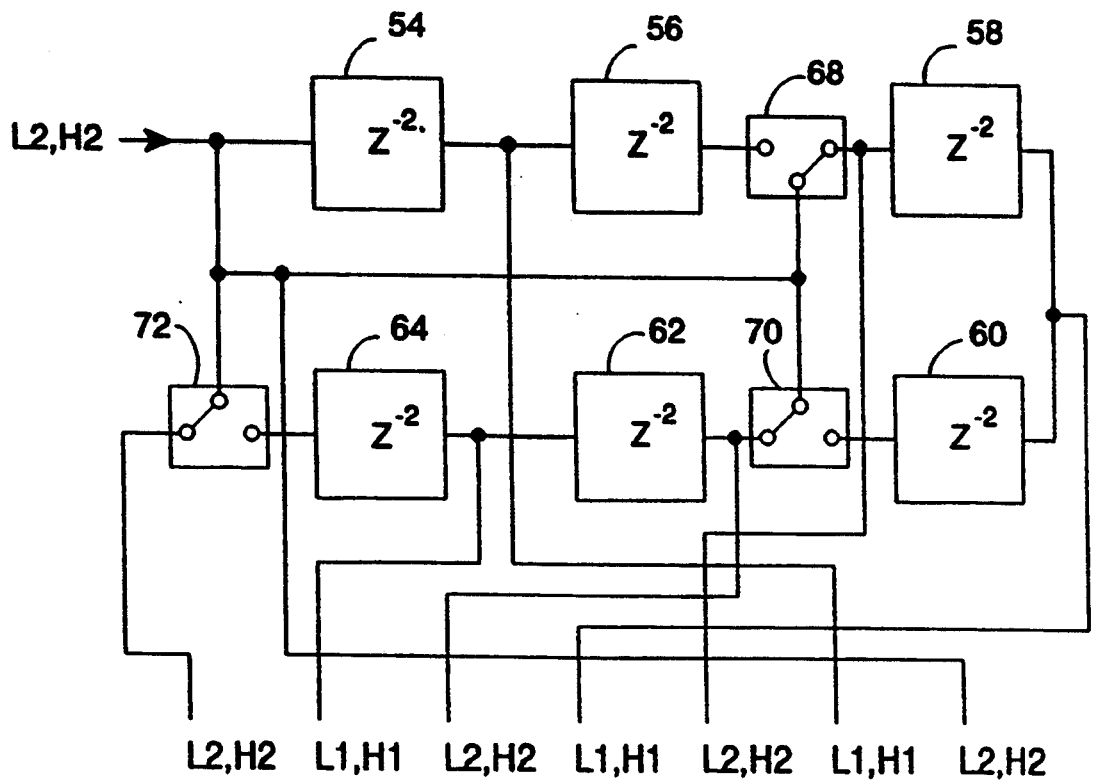
Figure 7C:
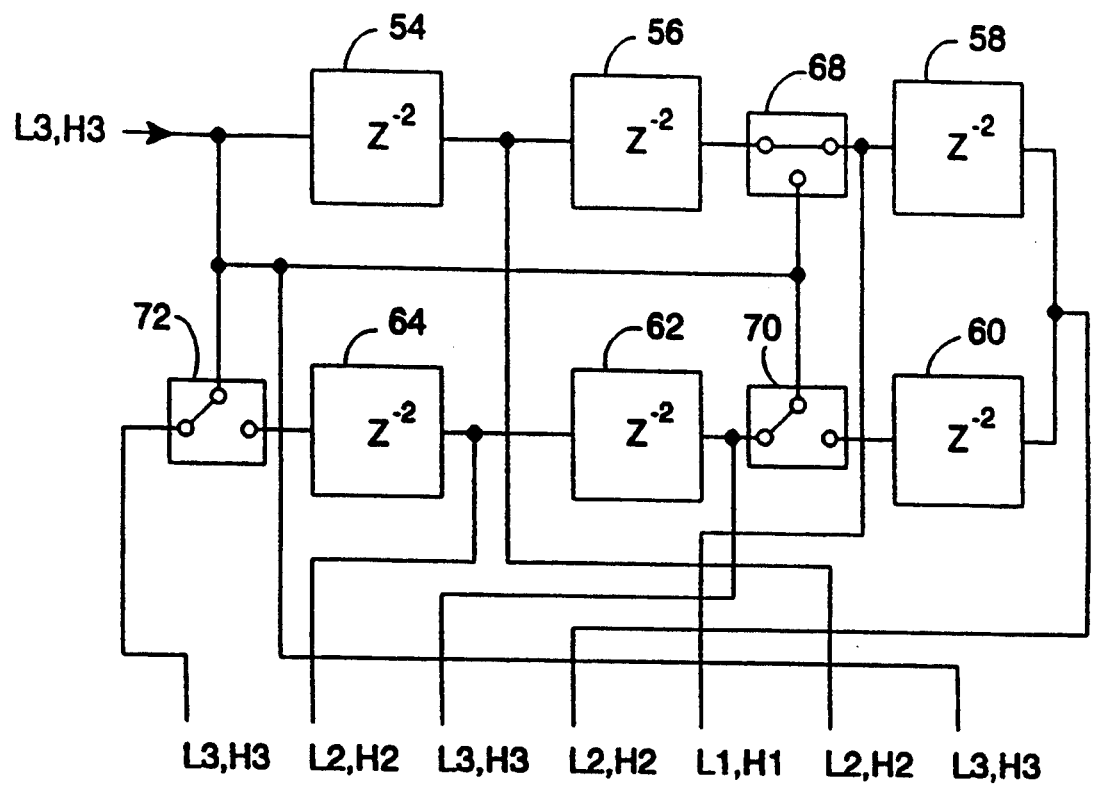
Figure 7D:
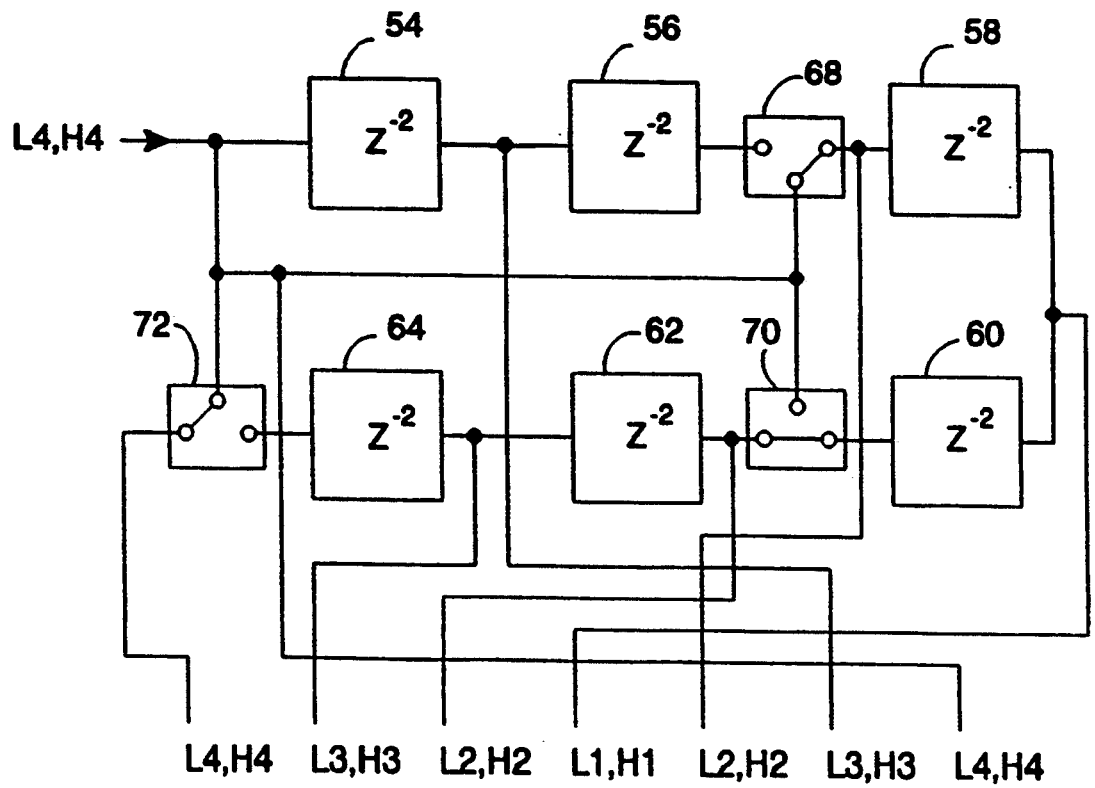
Figure 7E:
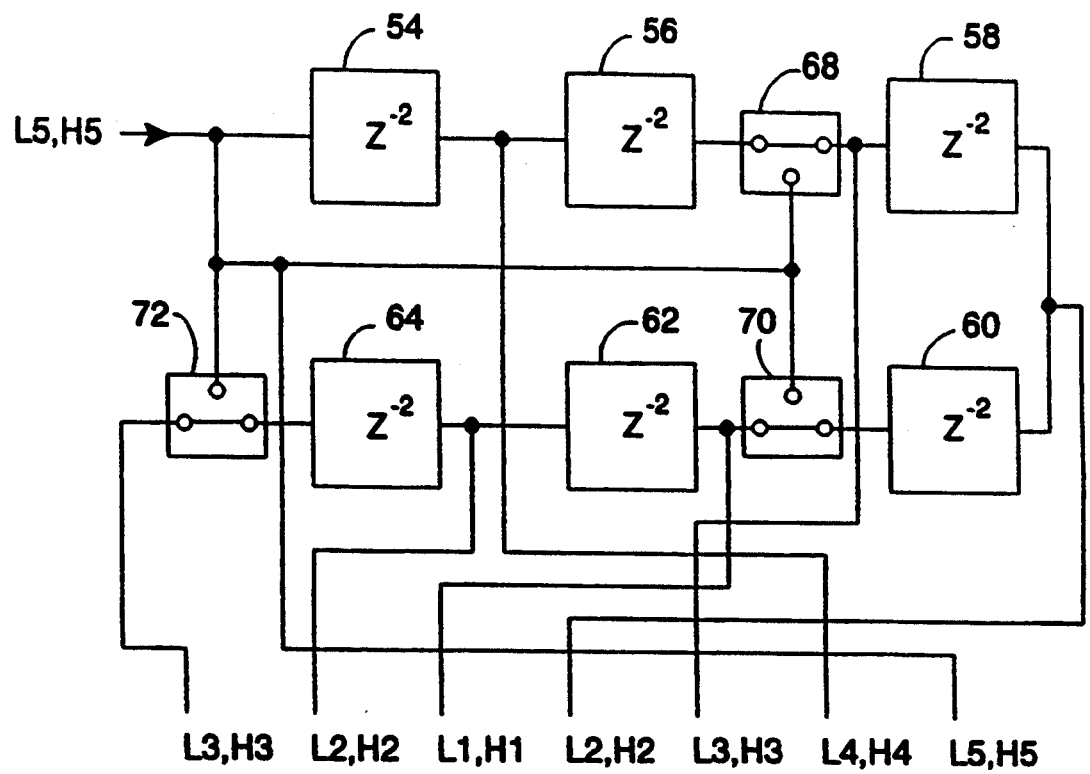
Figure 7F:
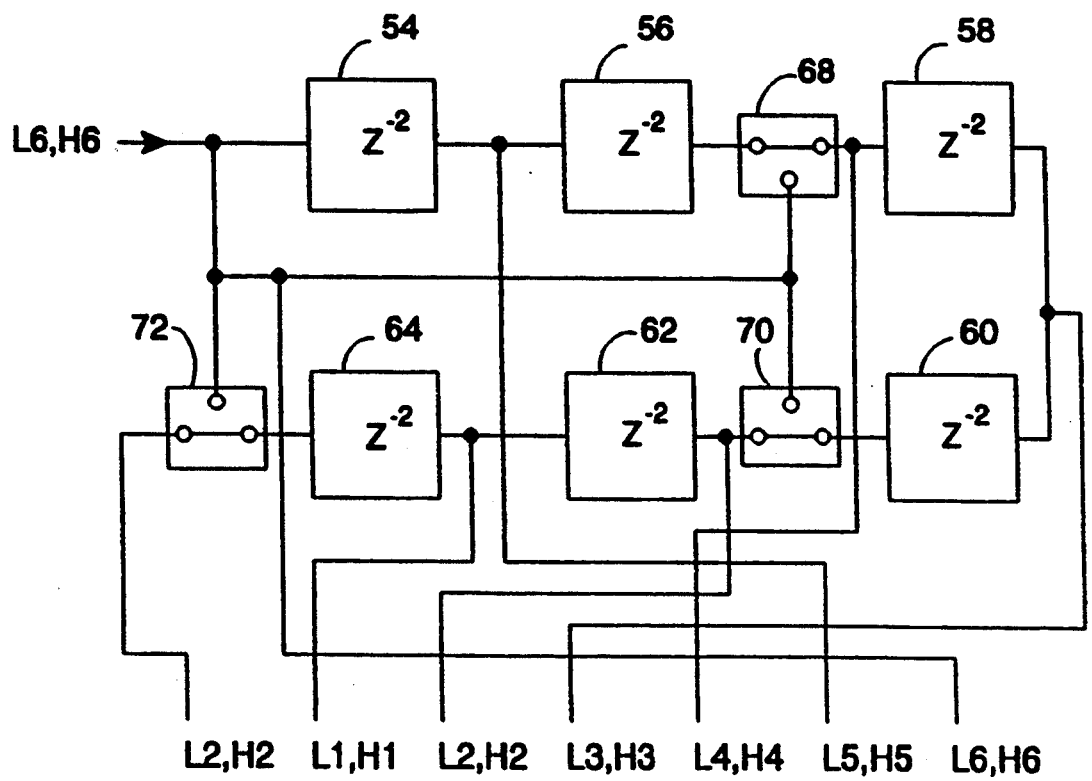

The switching operation of the two-way multiplexers 68, 70, 72 is the same as in FIGS. 2A to 2F. FIG. 7D corresponds to the first valid output filtered data value to be produced from the leading edge, with the leading edge data L1, H1 positioned at the central tap and the remaining taps being symmetric.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A digital filter for filtering blocks of data values, said digital filter comprising:
   a chain of delay elements for storing data values; and
   means for effecting symmetric edge extension of said blocks of data values including multiplexer means, and means for connecting said multiplexer means with said chain so that said multiplexer means selectively passes data values between inputs of non-adjacent delay elements.

2. A digital filter as claimed in claim 1, wherein said multiplexer means comprises an end of block multiplexer, and said means for connecting causes said end of block multiplexer to return data values from alternate delay elements to an input of an upstream delay element so that said symmetric edge extension is effected at a trailing edge of a block of data values.

3. A digital filter as claimed in claim 2, wherein said means for connecting causes said end of block multiplexer to return data values to an input of a first delay element within said chain of delay elements.

4. A digital filter as claimed in claim 1, wherein said multiplexer means comprises at least one start of block multiplexer, and said means for connecting causes said start of block multiplexer to pass data values to a downstream non-adjacent delay element so that said symmetric edge extension is effected at a leading edge of a block of data values.

5. A digital filter as claimed in claim 4, wherein said multiplexer means comprises a plurality of start of block multiplexers, and said means for connecting causes each of said start of block multiplexers to pass data values to a respective one of alternate delay elements.

6. A digital filter as claimed in claim 5, wherein said plurality of start of block multiplexers are operated to pass data values from respective inputs to a first delay element within said chain of delay elements.

7. A digital filter as claimed in claim 1, wherein said delay elements have a multisample delay period and said blocks of data values comprise multiplexed sets of data values, said digital filter further comprising means for providing switchable sets of filter coefficients for use with different multiplexed sets of data values.

8. A digital filter as claimed in claim 1, wherein said digital filter is configured for transforming image data between the spatial domain and the frequency domain.

9. A method of digitally filtering blocks of data values, said method comprising the steps of:
   storing data values within a chain of delay elements; and
   effecting symmetric edge extension of said blocks of data values by selectively passing data values between inputs of non-adjacent delay elements.

* * * * *